(12) United States Patent
Heo

(10) Patent No.: US 12,720,716 B2
(45) Date of Patent: Aug. 25, 2026

(54) COOLER FOR POWER MODULE OF INVERTER

(71) Applicant: HYUNDAI MOBIS CO., LTD., Seoul (KR)

(72) Inventor: Min Heo, Seoul (KR)

(73) Assignee: Hyundai Mobis Co., Ltd., Seoul (KR)

( * ) Notice: Subject to any disclaimer, the term of this patent is extended or adjusted under 35 U.S.C. 154(b) by 214 days.

(21) Appl. No.: 18/497,334

(22) Filed: Oct. 30, 2023

(65) Prior Publication Data

US 2024/0334660 A1 Oct. 3, 2024

(30) Foreign Application Priority Data

Mar. 28, 2023 (KR) ........................ 10-2023-0040343

(51) Int. Cl.
*H05K 7/20* (2006.01)
*H02M 7/00* (2006.01)
*H05K 7/14* (2006.01)

(52) U.S. Cl.
CPC ............ *H05K 7/209* (2013.01); *H02M 7/003* (2013.01); *H05K 7/14322* (2022.08)

(58) Field of Classification Search
None
See application file for complete search history.

(56) References Cited

U.S. PATENT DOCUMENTS 9,622,380 B1 * 4/2017 Joshi .................. H05K 7/20327
9,980,415 B2 * 5/2018 Zhou .................. H05K 7/20927
10,822,096 B2 * 11/2020 Yang .................. H05K 7/20254
10,932,396 B2 * 2/2021 Song .................. H05K 7/20927
11,071,233 B1 * 7/2021 Robert ................. H05K 9/0049
11,818,831 B2 * 11/2023 Karamavruc ........ H05K 1/0203
2006/0108098 A1 5/2006 Stevanovic et al.
2008/0237847 A1 * 10/2008 Nakanishi ................. F28F 3/12 257/722
2010/0175857 A1 * 7/2010 Gerstler .................... F28F 3/12 165/104.19
2010/0226093 A1 9/2010 Beaupre et al.
2017/0055378 A1 * 2/2017 Zhou .................. H05K 7/20927
2021/0176896 A1 * 6/2021 Yang .................. H05K 7/20254
2022/0248560 A1 * 8/2022 Zhou .................... H05K 7/2039

OTHER PUBLICATIONS

Extended European search report issued on May 21, 2024, in counterpart European Patent Application No. 23206726.4 (9 pages).

* cited by examiner

*Primary Examiner* — Courtney L Smith
(74) *Attorney, Agent, or Firm* — NSIP Law

(57) ABSTRACT

A cooler for a power module of an inverter includes power modules comprising chips arranged in a row direction and a column direction, a heat sink extending in a first direction parallel to the row direction, the power modules being coupled to one surface of the heat sink and a microfluidic channel comprising grooves disposed on another surface, and a housing comprising a first groove part comprising an inlet to receive a fluid and a first groove extending in a second direction to communicate with the inlet, a second groove part comprising an outlet to discharge the fluid and a second groove extending in the second direction to communicate with the outlet, and a separation part formed between the first groove part and the second groove part, wherein the heat sink is coupled to the housing to cause the first direction to be parallel to the second direction.

8 Claims, 4 Drawing Sheets

[FIG. 1]
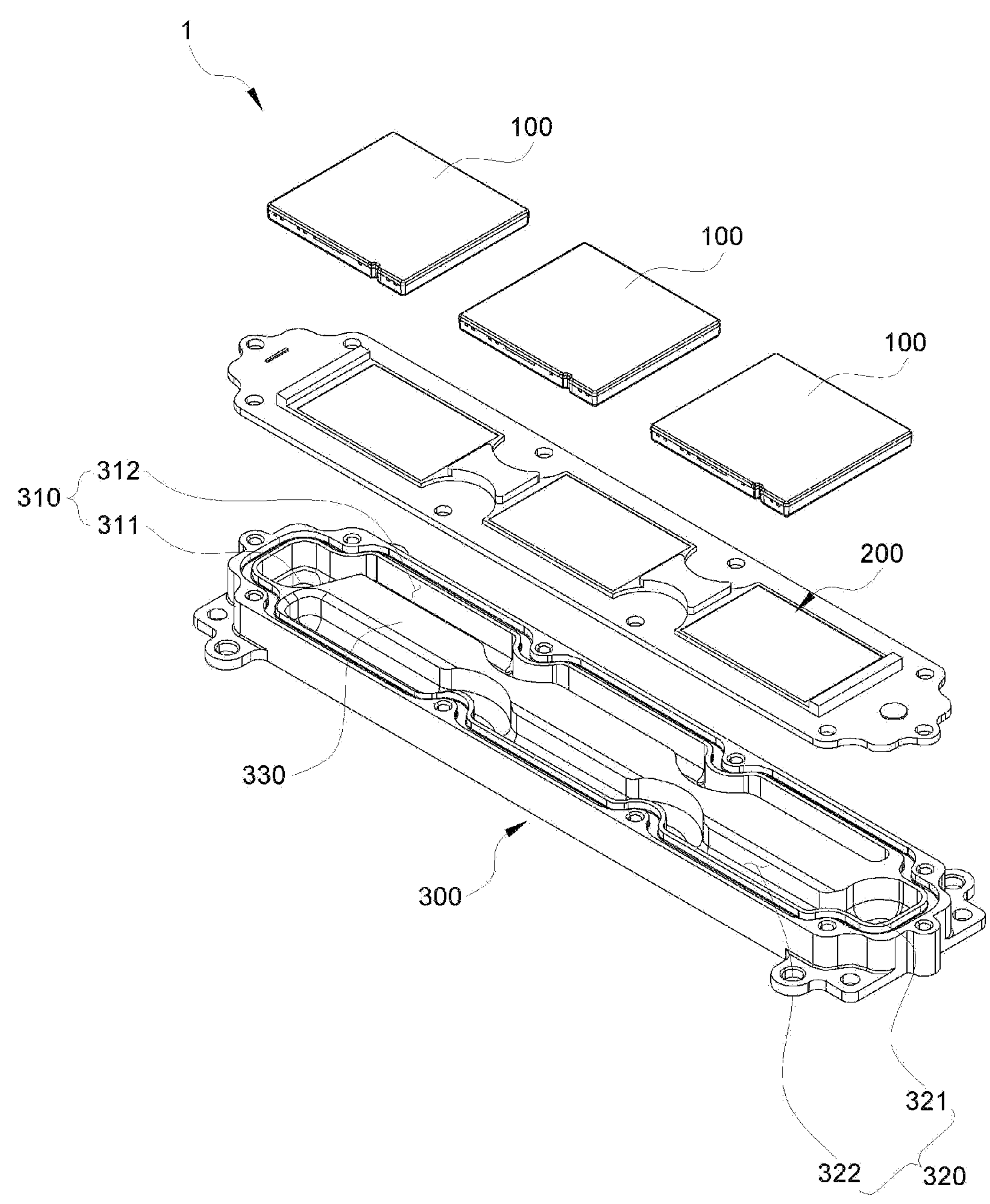

[FIG. 2]
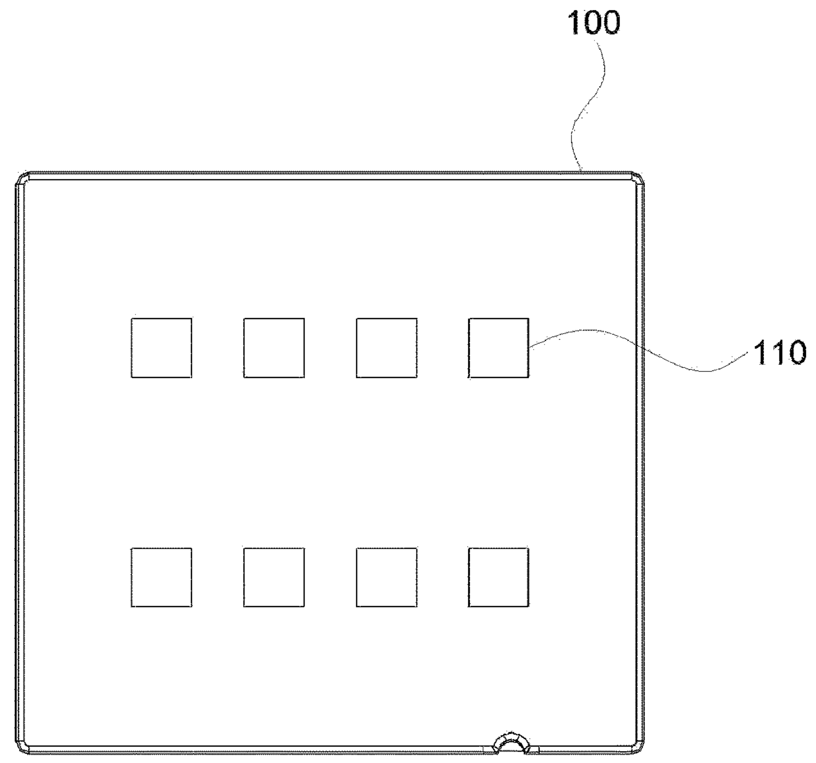
[FIG. 3]
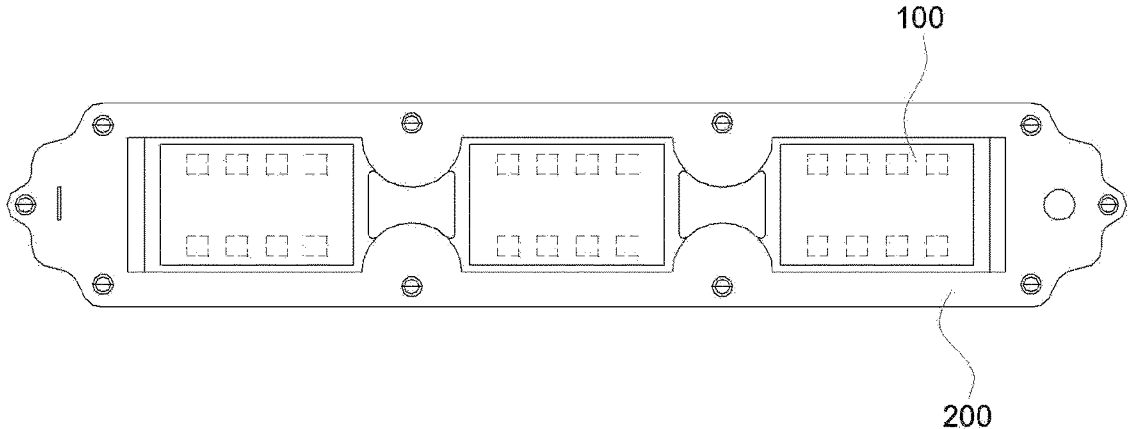

[FIG. 4]
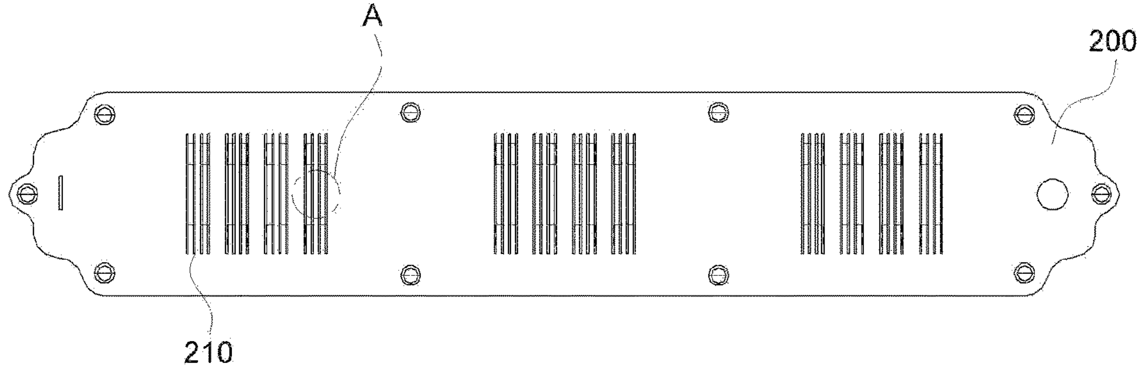
[FIG. 5]
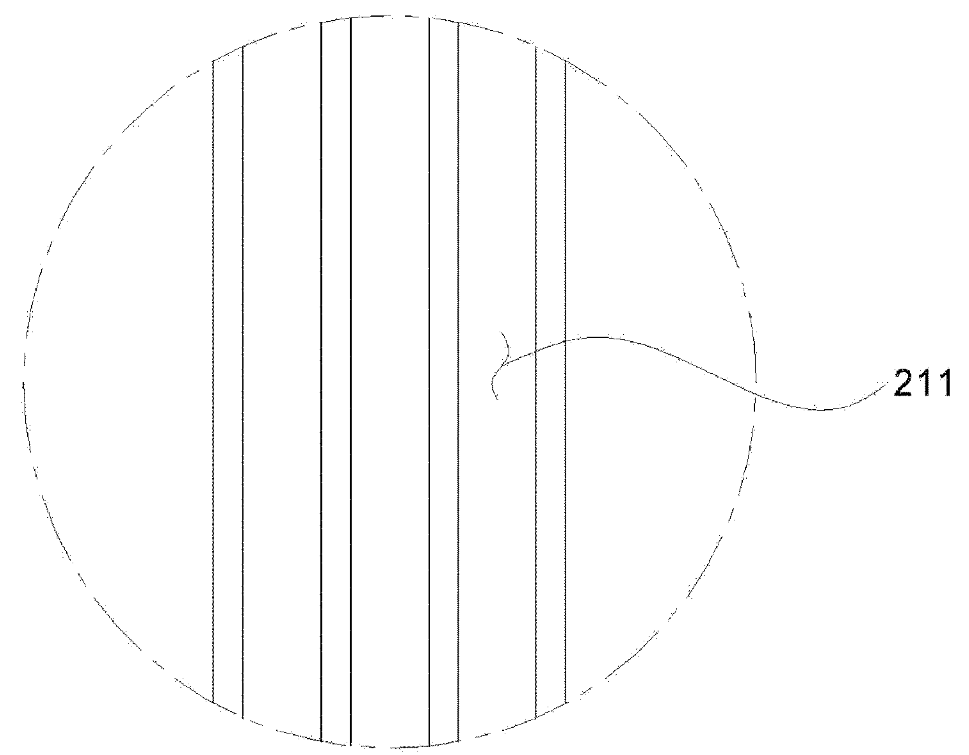

[FIG. 6]
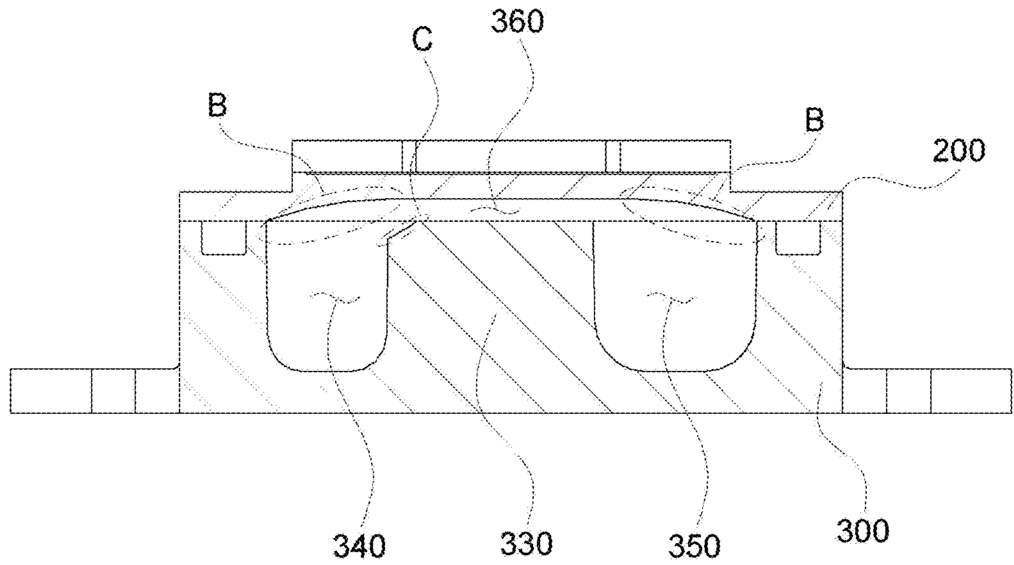
[FIG. 7]
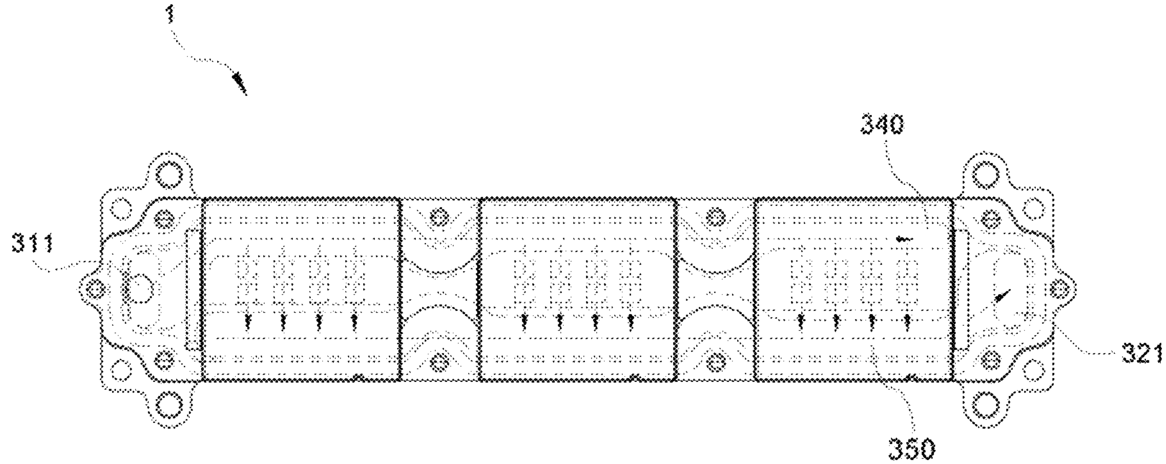

COOLER FOR POWER MODULE OF INVERTER

CROSS-REFERENCE TO RELATED APPLICATIONS

This application claims priority under 35 U.S.C. § 119 to Korean Patent Application No. 10-2023-0040343, filed on Mar. 28, 2023, in the Korean Intellectual Property Office, the entire disclosure of which is incorporated herein by reference for all purposes.

BACKGROUND

1. Field

The following disclosure relates to a cooler for a power module of an inverter, and more particularly, to a cooler for a power module of an inverter, which is configured to effectively cool a power module coupled to a heat sink.

2. Discussion of Related Art

In general, a vehicle is equipped with an inverter system as a power conversion device for converting high-voltage direct-current (DC) power generated from a battery or a fuel cell into alternating-current (AC) power of three phases (U-, V-, and W-phases).

Such an inverter system includes a power module, including a power conversion switching element (an insulated gate bipolar transistor (IGBT)), and a gate driving circuit.

When the inverter system operates, a large amount of heat is generated from a chip installed in a power module and emitting heat (hereinafter referred to as a chip) and thus a cooling structure such as a heat sink may be used to dissipate heat generated from the chip of the power module or the like.

For example, an existing power module cooling structure may employ a structure in which a pin is disposed on a base plate of a power module and the power module is watertight-treated and immersed in a housing with a flow path.

Specifically, either a serial cooling structure for cooling power modules corresponding to the U-, V-, and W-phases of an inverter by causing a fluid, such as cooling water flowing in a flow path (hereinafter referred to as a fluid), to flow through the power modules in series or a parallel cooling structure for cooling power modules corresponding to U-, V-, and W-phases of an inverter by causing a fluid to flow through the power modules in parallel is employed.

However, the serial cooling structure is configured to sequentially cool the power modules corresponding to the U-, V-, and W-phases of the inverter using a fluid and thus the power module at a rear end is less effectively cooled than the power module at a front end, thus increasing a temperature deviation between the power modules.

Meanwhile, the parallel cooling structure prevents an increase in a temperature deviation between the power modules but is configured to distribute a fluid to cause a relatively small amount of the fluid to flow through each of the power modules, thus reducing the cooling efficiency of each of the power modules.

Therefore, it is necessary to develop a cooler, for a power module of an inverter, to prevent an increase in a temperature deviation between a plurality of power modules and increase the cooling efficiency of each of the power modules.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, there is provided a cooler for a power module of an inverter, including power modules comprising chips arranged in a row direction and a column direction perpendicular to the row direction, a heat sink extending in a first direction parallel to the row direction, the power modules being coupled to one surface of the heat sink and a microfluidic channel comprising grooves disposed on another surface of the heat sink, the grooves extending in a longitudinal direction of the heat sink, and a housing comprising a first groove part comprising an inlet configured to receive a fluid and a first groove extending in a second direction to communicate with the inlet, a second groove part comprising an outlet configured to discharge the fluid and a second groove extending in the second direction to communicate with the outlet, and a separation part formed between the first groove part and the second groove part, wherein the heat sink is coupled to the housing to cause the first direction to be parallel to the second direction, the first groove is covered with the heat sink to form a first flow path, the second groove part is covered with the heat sink to form a second flow path, and the microfluidic channel covers the separation part to cause the grooves to form flow paths for communication of the first flow path and the second flow path, and wherein at least one of the chips is disposed in a vertical direction perpendicular to the row direction and the column direction from the flow path.

The longitudinal direction may be parallel to the column direction.

A cross-sectional area of the flow path perpendicular to the longitudinal direction may be less than a cross-sectional area of the first flow path perpendicular to the second direction.

The cross-sectional area of the flow path perpendicular to the longitudinal direction may be 0.1 times or more and 0.7 times or less of the cross-sectional area of the first flow path perpendicular to the second direction.

A cross-sectional area of the second flow path perpendicular to the second direction may be greater than the cross-sectional area of the first flow path perpendicular to the second direction.

A height of the first flow path in the vertical direction may increases in a direction from the first flow path to the second flow path, when the heat sink covers the first groove part, and a height of the second flow path in the vertical direction may decreases in the direction from the first flow path to the second flow path, when the heat sink covers the second first groove part.

A chamfer may be provided on a corner of the separation part adjacent to the first groove part.

The power modules may include three power modules corresponding to U-, V-, and W-phases of the inverter.

On another general aspect, there is provided a cooler for a heat generating device, including a heat sink extending in a first direction, the heat generating device being coupled to one surface of the heat sink and a microfluidic channel comprising grooves disposed on another surface of the heat sink, the grooves extending in a longitudinal direction of the heat sink, and a housing comprising a first groove part comprising an inlet configured to receive a fluid and a first groove extending in a second direction to communicate with the inlet, a second groove part comprising an outlet configured to discharge the fluid and a second groove extending in the second direction to communicate with the outlet, and a separation part formed between the first groove part and the second groove part, wherein the heat sink is coupled to the housing to cause the first direction to be parallel to the second direction, the first groove is covered with the heat sink to form a first flow path, the second groove part is covered with the heat sink to form a second flow path, and the microfluidic channel covers the separation part to cause the grooves to form flow paths for communication of the first flow path and the second flow path, and wherein at least one component of the heat generating device is disposed in a vertical direction perpendicular to the row direction and the column direction from the flow path.

Other features and aspects will be apparent from the following detailed description, the drawings, and the claims.

BRIEF DESCRIPTION OF THE DRAWINGS

FIG. 1 is an exploded perspective view of a cooler for a power module of an inverter according to an embodiment.

FIG. 2 is a plan view of a power module.

FIG. 3 is a plan view of one surface of a heat sink to which a power module is coupled;

FIG. 4 is a bottom view of another surface of the heat sink in which a microfluidic channel is installed.

FIG. 5 is an enlarged view of a region A of FIG. 4.

FIG. 6 is a cross-sectional view of a cooler for a power module of an inverter, taken in a direction perpendicular to a second direction.

FIG. 7 is a diagram illustrating a state in which a fluid flows in a cooler for a power module of an inverter.

Throughout the drawings and the detailed description, unless otherwise described or provided, the same drawing reference numerals will be understood to refer to the same elements, features, and structures. The drawings may not be to scale, and the relative size, proportions, and depiction of elements in the drawings may be exaggerated for clarity, illustration, and convenience.

DETAILED DESCRIPTION OF EMBODIMENTS

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness.

The features described herein may be embodied in different forms and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element is referred to as being "connected" to another element, it will be understood to include that the element is "directly connected" to the other element or is "electrically connected" to the other element with another element therebetween.

Throughout the specification, when an element is referred to as being "on" another element, it should be understood that the element is in contact with the other element or another element is present therebetween.

It will be understood that when an element is referred to as "including" another element, the element may further include other elements unless mentioned otherwise. In the specification, the terms such as "about" and "substantially" are used to indicate a corresponding numerical value or a value approximating thereto when a unique manufacturing or material allowable error is presented and to prevent accurate or absolute numerical values, which are presented to help the understanding of the present invention, from being unfairly used by unscrupulous infringers. As used throughout the specification of the present application, the term "operation to . . . " or "operation of . . . " should not be understood to mean "operation for . . . ".

Hereinafter, embodiments will be described in detail with reference to the accompanying drawings and the following description. The present invention is, however, not limited thereto and may be embodied in many different forms. Throughout the specification, the same reference numbers represent the same elements.

Hereinafter, a configuration of a cooler for a power module of an inverter according to an embodiment of the present invention will be described.

FIG. 1 is an exploded perspective view of a cooler for a power module of an inverter according to an embodiment.

Referring to FIG. 1, a cooler 1 for a power module of an inverter includes a plurality of power modules 100, a heat sink 200, and a housing 300.

First, the power module 100 will be described.

The power module 100 is commonly referred to as a power semiconductor module, and may include an insulated gate bipolar transistor (IGBT), a MOSFET or bipolar transistor, or the like and be formed by disposing a direct-bonded copper (DBC) substrate on an upper surface of a base plate and attaching a chip to the DBC substrate.

The plurality of power modules 100 may be included in the cooler 1 for a power module of an inverter. For example, the plurality of power modules 100 may be configured as three power modules 100 corresponding to the U-phase, V-phase, and W-phase of an inverter.

FIG. 2 is a plan view of a power module.

Referring to FIG. 2, a power module 100 may include a plurality of chips 110 arranged in parallel in a row direction and a column direction perpendicular to the row direction.

As described above, when an inverter system operates, high heat is generated from the chips 110 and the power module 100 may be effectively cooled by dissipating the heat generated from the chips 110.

Next, the heat sink 200 will be described.

The heat sink 200 is a thermally conductive thin plate to which the power module 100 from which heat is to be dissipated may be coupled, and extends in a first direction.

FIG. 3 is a plan view of one surface of a heat sink to which a power module is coupled.

As shown in FIG. 3, a plurality of power modules 100 are coupled to one surface of a heat sink 200 such that a row direction is parallel to a first direction.

FIG. 4 is a bottom view of another surface of the heat sink in which a microfluidic channel is installed. FIG. 5 is an enlarged view of a region A of FIG. 4.

As shown in FIG. 4, a microfluidic channel 210 may be installed on another surface of the heat sink 200.

The microfluidic channel 210 may employ a configuration of a conventional microfluidic channel through which a fluid may flow. As shown in FIG. 5, a plurality of fine grooves 211 extending in a longitudinal direction may be formed.

In this case, the microfluidic channel 210 may be formed such that the longitudinal direction in which the fine grooves 211 are formed is parallel to the column direction in which the plurality of chips 110 are arranged.

The microfluidic channel 210 covers a separation part 330, which will be described below, to form a fine flow path 360. At least one chip 110 among the plurality of chips 110 may be positioned in a vertical direction perpendicular to the row direction and the column direction from the fine flow path 360.

That is, the microfluidic channel 210 may be installed on the heat sink 200 such that the fine flow path 360 passes through a lower portion of the chips 110 included in the power module 100.

Next, the housing 300 will be described.

The housing 300 may have a structure in which a fluid may flow therein, and includes a first groove part 310, a second groove part 320, and the separation part 330 as shown in FIG. 1.

The first groove part 310 includes an inlet 311 into which a fluid is introducible and a first groove 312 extending in a second direction to communicate with the inlet 311, and the second groove part 320 includes an outlet 321 through which the fluid is dischargeable and a second groove 322 extending in the second direction to communicate with the outlet 321.

FIG. 6 is a cross-sectional view of a cooler for a power module of an inverter, taken in a direction perpendicular to a second direction.

As shown in FIG. 6, when the heat sink 200 is coupled to the housing 300 such that the first direction is parallel to the second direction, the heat sink 200 is covered with the first groove part 310 to form a first flow path 340 and the heat sink 200 is covered with the second groove part 320 to form a second flow path 350.

Here, a cross-sectional area of the second flow path 350 perpendicular to the second direction may be formed to be larger than that of the first flow path 340 perpendicular to the second direction to reduce a pressure loss of the fluid flowing in the cooler 1 for a power module of an inverter.

The separation part 330 may be formed between the first groove part 310 and the second groove part 320 to separate the first groove part 310 and the second groove part 320. As described above, when the heat sink 200 is coupled to the housing 300, the microfluidic channel 210 may cover the separation part 330 to form the fine flow path 360.

Here, a cross-sectional area of the fine flow path 360 perpendicular to the longitudinal direction may be formed to be smaller than that of the first flow path 340 perpendicular to the second direction, so that the fluid may flow quickly in the fine flow path 360 to effectively cool the plurality of power modules 100.

Specifically, the cross-sectional area of the fine flow path 360 perpendicular to the longitudinal direction may be set to be 0.1 times or more and 0.7 times or less of that of the first flow path 340 perpendicular to the second direction. In this case, the plurality of power modules 100 may be effectively cooled by the fluid flowing in the fine flow path 360.

A chamfer may be formed at a corner C of the separation part 330 adjacent to the first groove part 310, and when the chamfer is formed on the separation part 330, the fluid may more easily flow through the first flow path 340, the fine flow path 360, and the second flow path 350, thereby reducing a pressure loss of the fluid flowing in the cooler 1 for a power module of an inverter.

Meanwhile, when the heat sink 200 covers the first groove part 310, a vertical height of the first flow path 340 in a direction from the first flow path 340 to the second flow path 350 may gradually increase.

In addition, when the heat sink 200 covers the second groove part 320, a vertical height of the second flow path 350 in the direction from the first flow path 340 to the second flow path 350 may gradually decrease.

That is, as shown in FIG. 6, when the heat sink 200 is coupled to the housing 300, an inclined corner portion B may be provided on the first flow path 340 and the second flow path 350.

As described above, when the inclined corner portion B is provided on the first flow path 340 and the second flow path 350, the fluid may more easily flow through the first flow path 340, the fine flow path 360, and the second flow path 350, thereby reducing a pressure loss of the fluid flowing in the cooler 1 for a power module of an inverter.

Hereinafter, operations and effects of a cooler for a power module of an inverter according to an embodiment will be described.

FIG. 7 is a diagram illustrating a state in which a fluid flows in a cooler for a power module of an inverter.

Referring to FIG. 7, when a fluid such as cooling water flows into the inlet 311 of the housing 300, the fluid flows in the first flow path 340 and thereafter flows into a plurality of fine flow paths 360, thus dissipating heat generated from the plurality of power modules 100.

In this case, the fine flow path 360 is formed to have a smaller cross-sectional area than that of the first flow path 340 and to pass through a lower portion of the chip 110 generating a large amount of heat. Therefore, the fluid flowing in the fine flow path 360 flows at a high speed to effectively cool the power module 200.

The fluid passing through the inside of the plurality of fine flow paths 360 flows into the second flow path 350 and thereafter is discharged to the outside of the cooler 1 for a power module of an inverter through the outlet 321 of the housing 300.

In the cooler 1 for a power module of an inverter, the second flow path 350 is formed to have a larger cross-sectional area than that of the first flow path 340, the inclined corner portion B is formed on the first flow path 340 and the second flow path 350, and a chamfer is formed on the corner C of the separation part 330 adjacent to the first groove part 310, thereby reducing a pressure loss of the fluid flowing in the cooler 1 for a power module of an inverter.

As described above, a cooler for a power module of an inverter according to an embodiment is configured to cause a fluid to flow through power modules of an inverter in parallel to cool the power modules, thereby preventing an increase in a temperature deviation between the plurality of power modules.

A fine flow path formed by a microfluidic channel is configured to be located in a lower portion of a chip that generates a large amount of heat and to have a relatively narrow cross-sectional area to allow the fluid to flow at a high speed, thereby achieving an effect of effectively cooling each of the power modules.

In addition, a cross-sectional area of a second flow path is set to be larger than that of a first flow path, an inclined corner portion is provided on the first flow path and the second flow path, and a chamfer is provided on a corner of a separation part to minimize a pressure loss of a fluid flowing to cool a plurality of power modules, thereby reducing load on a device such as a water pump for injecting the fluid.

According to an embodiment, a cooler for a power module of an inverter is configured to cause a fluid to flow through power modules of an inverter in parallel to cool the power modules of the inverter, thereby preventing an increase in a temperature deviation between the power modules.

A fine flow path formed by a microfluidic channel is configured to be located in a lower portion of a chip that generates a large amount of heat and to have a relatively narrow cross-sectional area to allow the fluid to flow at a high speed, thereby achieving an effect of effectively cooling each of the power modules.

In addition, a cross-sectional area of a second flow path is set to be larger than that of a first flow path, an inclined corner portion is provided on the first flow path and the second flow path, and a chamfer is provided on a corner of a separation part to minimize a pressure loss of a fluid flowing to cool a plurality of power modules, thereby reducing load on a device such as a water pump for injecting the fluid.

As disclosed above, there is provided a cooler for a power module of an inverter, which is capable of preventing an increase in a temperature deviation between a plurality of power modules.

As disclosed above, there is provided a cooler for a power module of an inverter, which is capable of effectively cooling each of a plurality of power modules when the plurality of power modules are cooled.

As disclosed above, there is provided a cooler for a power module of an inverter, which is capable of minimizing a pressure loss of a fluid flowing to cool a plurality of power modules.

The above description of the present invention is intended to provide examples, and it will be understood by those of ordinary skill in the art that modifications may be easily made without departing from the technical idea or essential features of the present invention. Therefore, it should be understood that the embodiments of the present invention described above are merely examples in all respects and not restrictive. For example, components each described as a single type may be implemented in a distributed manner, and components described as being distributed may be implemented in a combined form.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents.

Therefore, the scope of the disclosure is defined not by the detailed description, but by the claims and their equivalents, and all variations within the scope of the claims and their equivalents are to be construed as being included in the disclosure.

REFERENCE NUMERALS

1: cooler for power module of inverter
100: power module
110: chip
200: heat sink
210: microfluidic channel
211: fine groove
300: housing
310: first groove part
320: second groove part
330: separation part
340: first flow path
350: second flow part
360: fine flow path

What is claimed is:

1. A cooler for a power module of an inverter, comprising:
power modules comprising chips arranged in a row direction and a column direction perpendicular to the row direction;
a heat sink extending in a first direction parallel to the row direction, the power modules being coupled to one surface of the heat sink and a microfluidic channel comprising grooves disposed on another surface of the heat sink, the grooves extending in a longitudinal direction of the heat sink; and
a housing comprising a first groove part comprising an inlet configured to receive a fluid and a first groove extending in a second direction that is substantially parallel to the first direction to communicate with the inlet, a second groove part comprising an outlet configured to discharge the fluid and a second groove extending in the second direction to communicate with the outlet, and a separation part formed between the first groove part and the second groove part,
wherein the first direction is a direction defined along the heat sink and the second direction is a direction defined along the first groove and the second groove,
wherein the heat sink is coupled to the housing to cause the first direction to be parallel to the second direction, the first groove is covered with the heat sink to form a first flow path, the second groove is covered with the heat sink to form a second flow path, and the microfluidic channel covers the separation part to cause the grooves to form a third flow path that fluidly connects the first flow path and the second flow path, and
wherein at least one of the chips is disposed in a vertical direction perpendicular to the row direction and the column direction from the third flow path,
wherein the longitudinal direction is parallel to the column direction, and
wherein a cross-sectional area of the third flow path perpendicular to the longitudinal direction is less than a cross-sectional area of the first flow path perpendicular to the second direction.

2. The cooler of claim 1, wherein the cross-sectional area of the third flow path perpendicular to the longitudinal direction is 0.1 times or more and 0.7 times or less of the cross-sectional area of the first flow path perpendicular to the second direction.

3. The cooler of claim 2, wherein a cross-sectional area of the second flow path perpendicular to the second direction is greater than the cross-sectional area of the first flow path perpendicular to the second direction.

4. The cooler of claim 3, wherein a height of the first flow path in the vertical direction increases in a direction from the first flow path to the second flow path, when the heat sink covers the first groove part, and a height of the second flow path in the vertical direction decreases in the direction from the first flow path to the second flow path, when the heat sink covers the second first groove part.

5. The cooler of claim 3, wherein a chamfer is provided on a corner of the separation part adjacent to the first groove part.

6. The cooler of claim 4, wherein the power modules comprise three power modules corresponding to U-, V-, and W-phases of the inverter.

7. The cooler of claim 5, wherein the power modules comprise three power modules corresponding to U-, V-, and W-phases of the inverter.

8. A cooler for a heat generating device, comprising:

a heat sink extending in a first direction, the heat generating device being coupled to one surface of the heat sink and a microfluidic channel comprising grooves disposed on another surface of the heat sink, the grooves extending in a longitudinal direction of the heat sink; and a housing comprising a first groove part comprising an inlet configured to receive a fluid and a first groove extending in a second direction that is substantially parallel to the first direction to communicate with the inlet, a second groove part comprising an outlet configured to discharge the fluid and a second groove extending in the second direction to communicate with the outlet, and a separation part formed between the first groove part and the second groove part, wherein the first direction is a direction defined along the heat sink and the second direction is a direction defined along the first groove and the second groove, wherein the heat sink is coupled to the housing to cause the first direction to be parallel to the second direction, the first groove is covered with the heat sink to form a first flow path, the second groove is covered with the heat sink to form a second flow path, and the microfluidic channel covers the separation part to cause the grooves to form a third flow path that fluidly connects the first flow path and the second flow path, and wherein at least one component of the heat generating device is disposed in a vertical direction perpendicular to first direction and the longitudinal direction from the third flow path.

* * * * *